(12) United States Patent
Kim

(10) Patent No.: US 8,631,291 B2
(45) Date of Patent: Jan. 14, 2014

(54) SEMICONDUCTOR DEVICE AND TEST METHOD WITH BOUNDARY SCAN

(75) Inventor: Ki-Tae Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 96 days.

(21) Appl. No.: 13/333,959

(22) Filed: Dec. 21, 2011

(65) Prior Publication Data

US 2012/0278673 A1 Nov. 1, 2012

(30) Foreign Application Priority Data

Apr. 27, 2011 (KR) ........................ 10-2011-0039668

(51) Int. Cl.
*G01R 31/28* (2006.01)

(52) U.S. Cl.
USPC .......................................... 714/731; 714/727

(58) Field of Classification Search
USPC ................................................ 714/727, 731
See application file for complete search history.

(56) References Cited

U.S. PATENT DOCUMENTS

| | | | | |
|---|---|---|---|---|
| 7,222,276 B2 * | 5/2007 | Kashiwagi | ..................... | 714/726 |
| 7,334,172 B2 * | 2/2008 | Howard et al. | ................ | 714/726 |
| 7,613,972 B2 * | 11/2009 | Takeoka et al. | ................ | 714/731 |
| 7,640,461 B2 * | 12/2009 | Nguyen et al. | ................. | 714/700 |
| 7,952,390 B2 * | 5/2011 | Takatori et al. | .................. | 326/93 |
| 8,028,209 B2 * | 9/2011 | Li et al. | ........................... | 714/731 |
| 8,055,965 B2 * | 11/2011 | Kaneko | ......................... | 714/729 |
| 8,127,188 B2 * | 2/2012 | Hasegawa | ...................... | 714/731 |
| 8,412,994 B2 * | 4/2013 | Devta-Prasanna | ............ | 714/731 |

FOREIGN PATENT DOCUMENTS

| | | |
|---|---|---|
| KR | 1019960014957 | 5/1996 |
| KR | 1020030020594 | 3/2003 |
| KR | 1020030028293 | 4/2003 |
| KR | 1020100050933 | 5/2010 |

OTHER PUBLICATIONS

Notice of Allowance issued by the Korean Intellectual Property Office on Jan. 14, 2013.
Office Action issued by the Korean Intellectual Property Office on Jun. 20, 2012.

* cited by examiner

*Primary Examiner* — James C Kerveros
(74) *Attorney, Agent, or Firm* — IP & T Group LLP

(57) ABSTRACT

A semiconductor device includes a clock control unit configured to receive an external test clock signal in a boundary scan test mode and generate a boundary test clock signal in synchronization with an entry time point of the boundary scan test mode, and a plurality of latches configured to receive and store a plurality of data in parallel in a boundary capture test mode and form a boundary scan path to sequentially output the plurality of stored data in the boundary scan test mode in response to the boundary test clock signal.

10 Claims, 7 Drawing Sheets

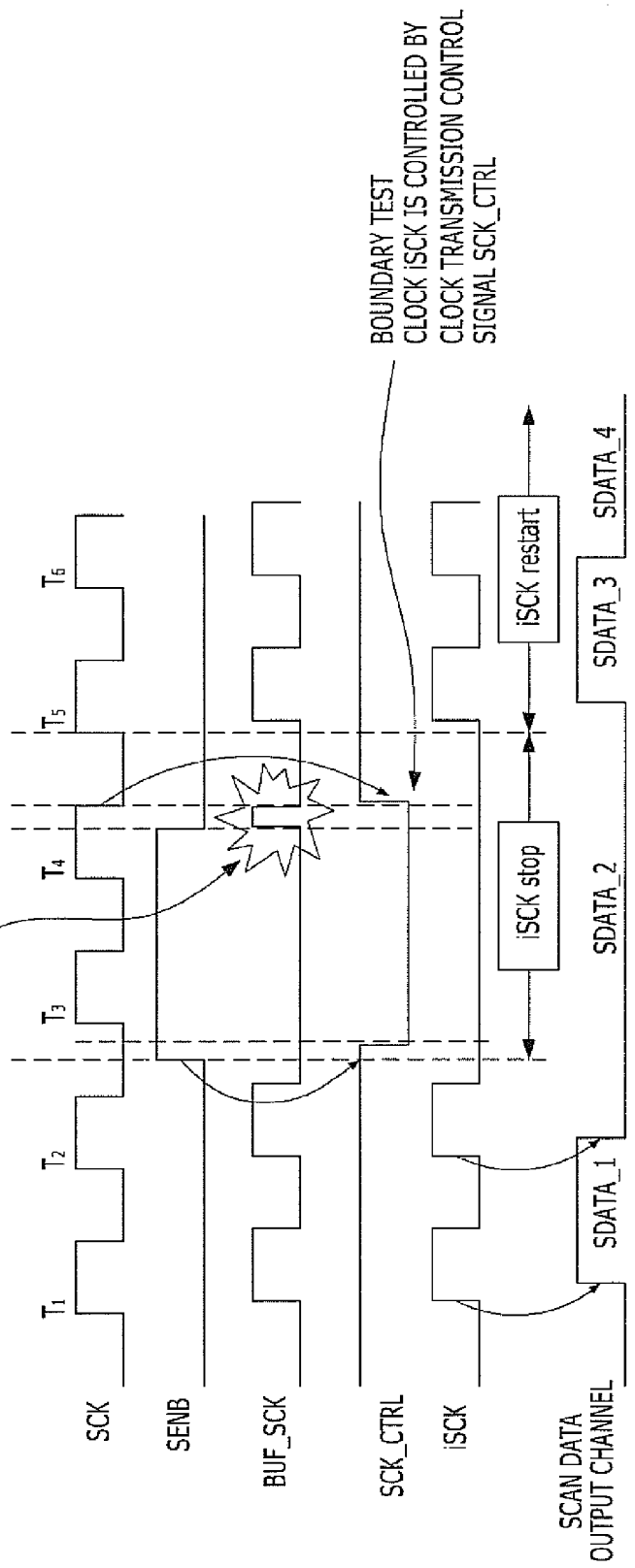

SEMICONDUCTOR DEVICE AND TEST METHOD WITH BOUNDARY SCAN

CROSS-REFERENCE TO RELATED APPLICATIONS

The present application claims priority of Korean Patent Application No. 10-2011-0039668, filed on Apr. 27, 2011, which is incorporated herein by reference in its entirety.

BACKGROUND

1. Field

Exemplary embodiments of the present invention relate to semiconductor design technology, and more particularly, to boundary scan test technology of a semiconductor device.

2. Description of the Related Art

With high performance and high integration of semiconductor devices, the number of interface pins or balls for the semiconductor devices to exchange signals with the outside has increased. In general, a semiconductor device checks a connection state between an external input channel and an interface pin through a boundary scan test. That is, since interface pins are allocated to a plurality of external input channels, respectively, test data signals inputted through the plurality of input channels are transmitted through the interface pins. Then, the test data signals are buffered and latched in the semiconductor device and outputted to the outside through a boundary scan path to check the connection state between the input channels and the interface pins.

FIG. 1A is a block diagram and timing diagram illustrating an operation of a boundary capture test mode during a boundary scan test of a conventional semiconductor device.

FIG. 1B is a block diagram and timing diagram illustrating an operation of a boundary scan test mode during the boundary scan test of the conventional semiconductor device.

In general, the boundary scan test includes the boundary capture test mode of FIG. 1A and the boundary scan test mode of FIG. 1B.

Referring to FIG. 1A, in the boundary capture test mode when both of a scan test entry signal SENB and a capture test entry signal SSH are activated to a logic low level, a plurality of data DATA_0 to DATA_3 are applied in parallel from a system to the semiconductor device.

Referring to FIG. 1B, in the boundary scan test mode when the scan test entry signal SENB is activated to a logic low level and the capture test entry signal SSH is deactivated to a logic high level, the plurality of data DATA_0 to DATA_3 stored in the boundary capture test mode are sequentially transmitted through a boundary scan path and outputted to the outside of the semiconductor device through a scan data output channel.

FIG. 2 is a block diagram illustrating a circuit to perform a boundary scan test in the conventional semiconductor device.

Referring to FIG. 2, the circuit to perform a boundary scan test in the conventional semiconductor device includes a plurality of clock buffers 200<0>, 200<1>, . . . , a plurality of latches 220<0>, 220<1>, . . . , and a plurality of data buffers 210<0>, 210<1>, . . . . The plurality of clock buffers 200<0>, 200<1>, . . . are configured to receive and buffer a boundary test clock signal SCK in the boundary scan test mode. The plurality of latches 210<0>, 210<1>, . . . are configured to receive and store a plurality of data DATA_0, DATA_1, . . . in parallel in the boundary capture test mode, and form a boundary scan path to sequentially output the plurality of stored data . . . , SDATA_1, and SDATA_0 in the boundary scan test mode. The operations of the latches 210<0>, 210<1>, . . . are controlled in response to an output clock signal iSCK of the clock buffers 200<0>, 200<1>, . . . . The plurality of data buffers 210<0>, 210<1>, . . . are configured to buffer the plurality of data DATA_0, DATA_1, . . . , respectively.

FIG. 3 is a timing diagram illustrating an operation of the circuit performing a boundary scan test in the conventional semiconductor device shown in FIG. 2.

Referring to FIG. 3, the circuit to perform a boundary scan test in the conventional semiconductor device sequentially outputs a plurality of data DATA_1, DATA_2, . . . , DATA_K, DATA_K+1, and DATA_K+2 through the scan data output channel at the respective rising edges of the buffered boundary test clock signal iSCK in a state that the scan test entry signal SENB is activated to a logic low level and the capture test entry signal SSH is deactivated to a logic high level.

When the scan test entry signal SENB transitions from the activation state at a logic low level to the deactivation state at a logic high level, the boundary scan test mode ends. Data outputting through the scan data output channel, among the plurality of data DATA_1, DATA_2, . . . , DATA_K, DATA_K+1, and DATA_K+2 sequentially outputted, is maintained in a holding state.

Then, when the scan test entry signal SENB transitions from the deactivation state at a logic high level to the activation state at a logic low level, the boundary scan test mode starts again. The holding state of the outputting data ends, and next data are successively outputted at the respective rising edges of the buffered boundary test clock iSCK.

That is, the plurality of data DATA_1, DATA_2, DATA_1, DATA_2, . . . , DATA_K, DATA_K+1, and DATA_K+2 stored in the plurality of latches 220<0>, 220<1>, . . . , respectively, are outputted through the scan data output channel, based on the logic level of the scan test entry signal SENB.

Here, when the scan test entry signal SENB transitions from the deactivation state at a logic high level to the activation state at a logic low level in the deactivation period of the boundary test clock signal SCK (A), the holding state of the outputting data, e.g., DATA_K, is maintained during the deactivation period the boundary test clock signal SCK (A). The next data, e.g., DATA_K+2, may be outputted at the next rising edge of the buffered boundary test clock signal iSCK without any error.

However, when the scan test entry signal SENB transitions from the deactivation state at a logic high level to the activation state at a logic low level in the activation period of the boundary test clock signal SCK (B), the buffered boundary test clock signal iSCK is unexpectedly toggled by the activated boundary test clock signal SCK right after the scan test entry signal SENB transitions to the activation state. The holding state of the outputting data DATA_K suddenly ceases in response to the unexpected toggling, and the next data DATA_K+1 is outputted. That is, although the scan test entry signal SENB is toggled to delay the time point when the data DATA_K+1 is outputted through the scan data output channel for certain reasons, the data DATA_K+1 may be outputted earlier than a set time as the toggling is completed at the end of the activation period of the boundary test clock signal SCK. For reference, the reasons may indicate the conditions of various operations for the semiconductor device to be used as products.

SUMMARY

Exemplary embodiments of the present invention are directed to a semiconductor device to perform a boundary scan test which is capable of effectively controlling an output time point of data outputted through a scan data output channel.

In accordance with an exemplary embodiment of the present invention, a semiconductor device includes a clock control unit configured to receive an external test clock signal in a boundary scan test mode and generate a boundary test clock signal in synchronization with an exit time point of the boundary scan test mode, and a plurality of latches configured to form a boundary scan path to sequentially output a plurality of data in the boundary scan test mode in response to the boundary test clock signal.

In accordance with another exemplary embodiment of the present invention, a semiconductor device includes at least one latch configured to store test data serially received from an outside; a scan path configured to output serially the test data stored in the latch; and a control unit configured to control the latch to serially store the test data in a boundary capture test mode and control the scan path to serially output the test data stored in the latch in a boundary scan test mode. The control unit may control a teat outputted at a first moment in which the semiconductor device exits from the boundary scan test mode to be held as an output data and control a next test data subsequent to the held test data to be outputted at a second moment after the first moment, in which the semiconductor device enters the boundary scan test mode again.

In accordance with still another exemplary embodiment of the present invention, a method for testing a semiconductor device having at least one latch and a scan path, includes serially receiving test data from an outside; serially storing the test data in the latch, in a boundary capture test mode, serially outputting the test data stored in the latch to the scan path, in a boundary scan test mode, holding a test data outputted at a first moment in which the semiconductor device exits from the boundary scan test mode as an output data, and outputting a next test data subsequent to the held test data at a second moment after the first moment, in which the semiconductor device enters the boundary scan test mode again.

BRIEF DESCRIPTION OF THE DRAWINGS

FIG. 6 is a timing diagram illustrating the operation of the circuit performing a boundary scan test in the semiconductor device shown in FIG. 4 in accordance with the exemplary embodiment of the present invention.

DETAILED DESCRIPTION

Figure 1A:
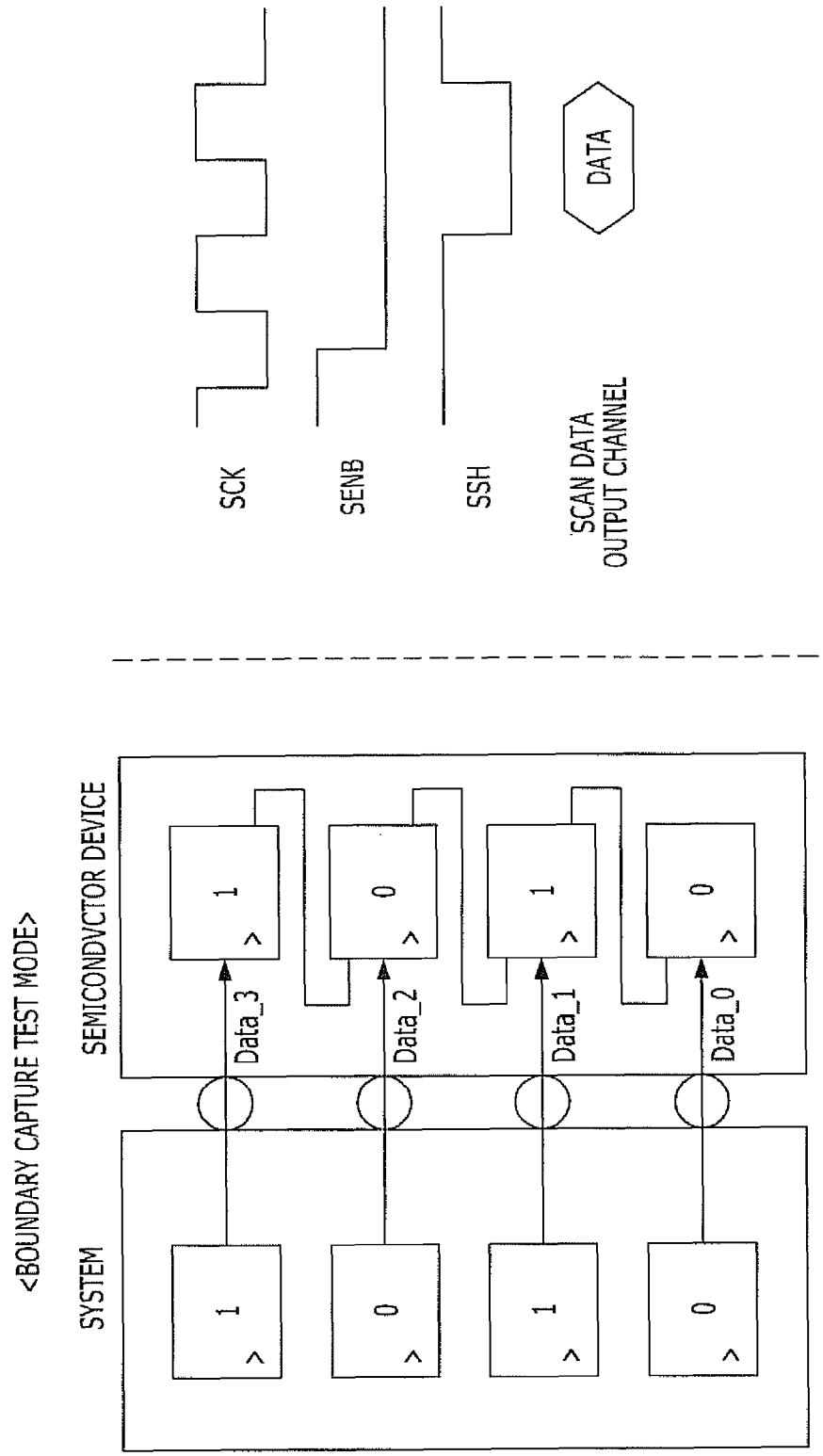
FIG. 1A is a block diagram and timing diagram illustrating an operation of a boundary capture test mode during a boundary scan test of a conventional semiconductor device.
Figure 1B:
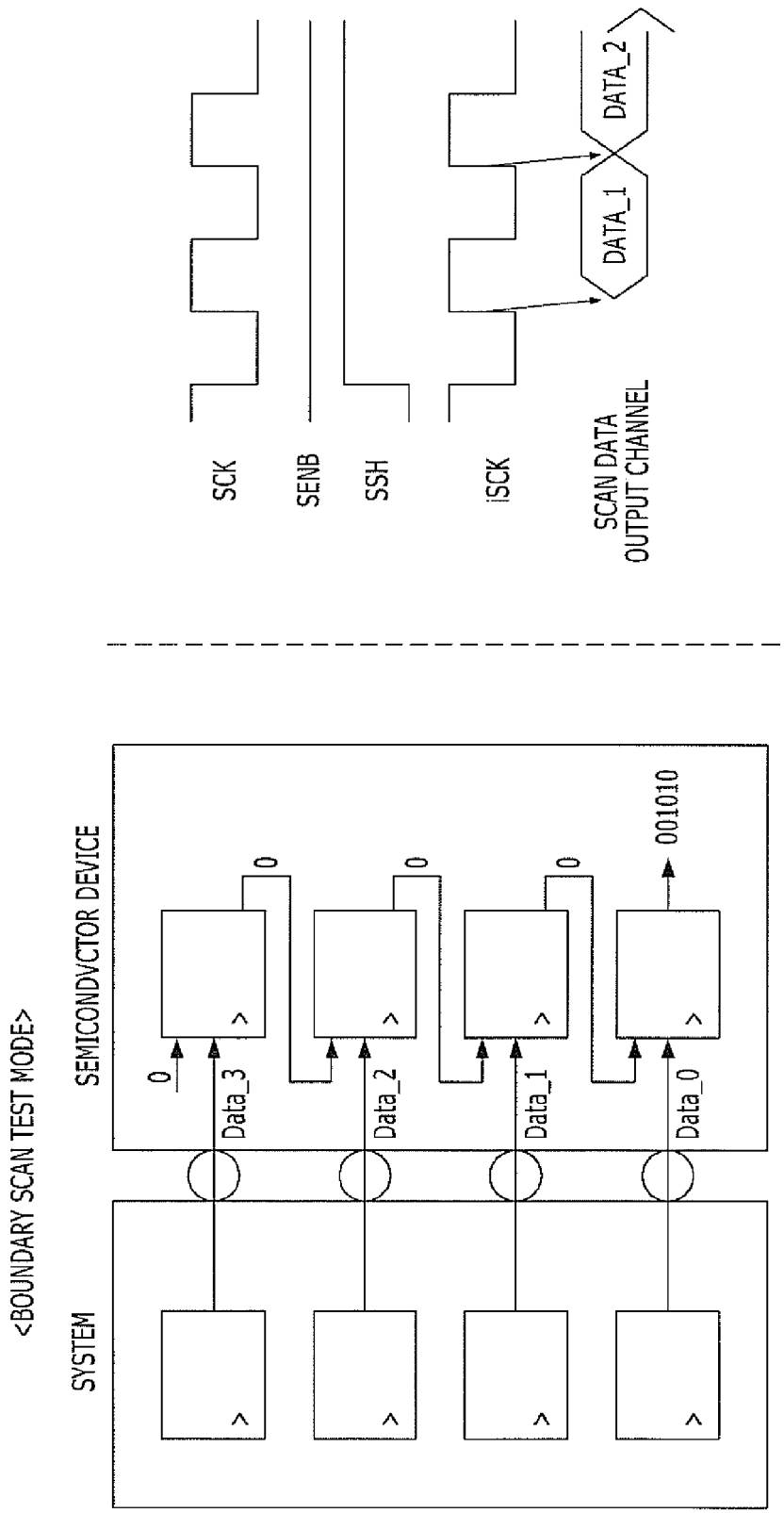
FIG. 1B is a block diagram and timing diagram illustrating an operation of a boundary scan test mode during the boundary scan test of the conventional semiconductor device.
Figure 2:
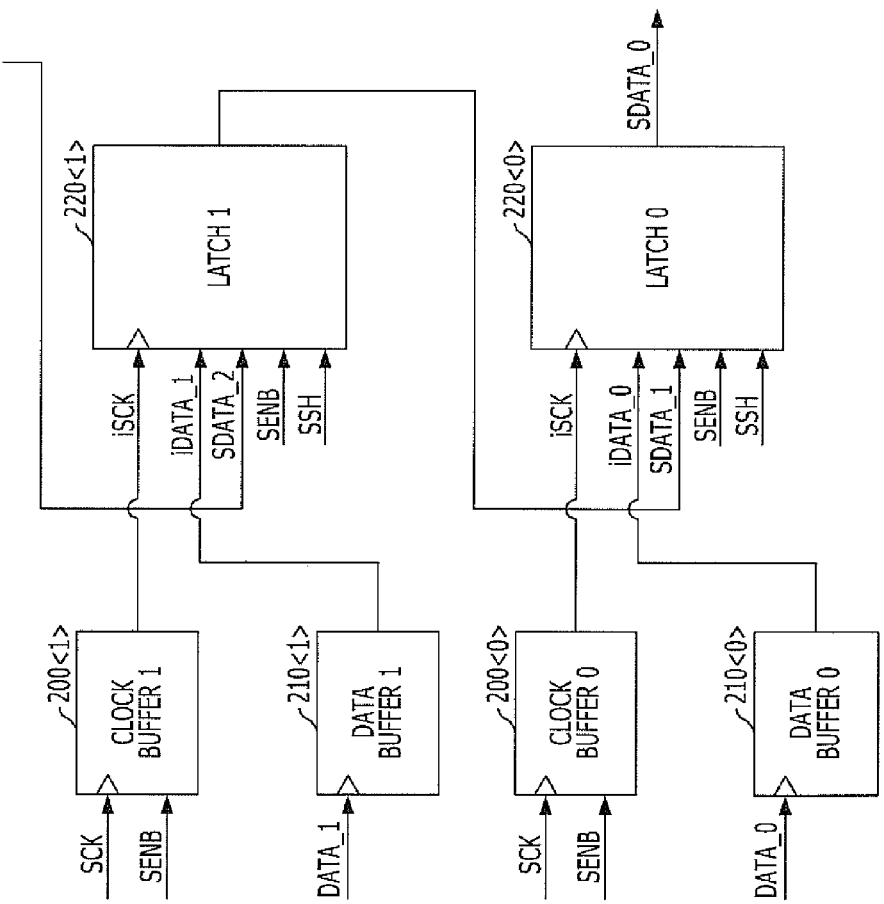
FIG. 2 is a block diagram illustrating a circuit to perform a boundary scan test in the conventional semiconductor device.
Figure 3:
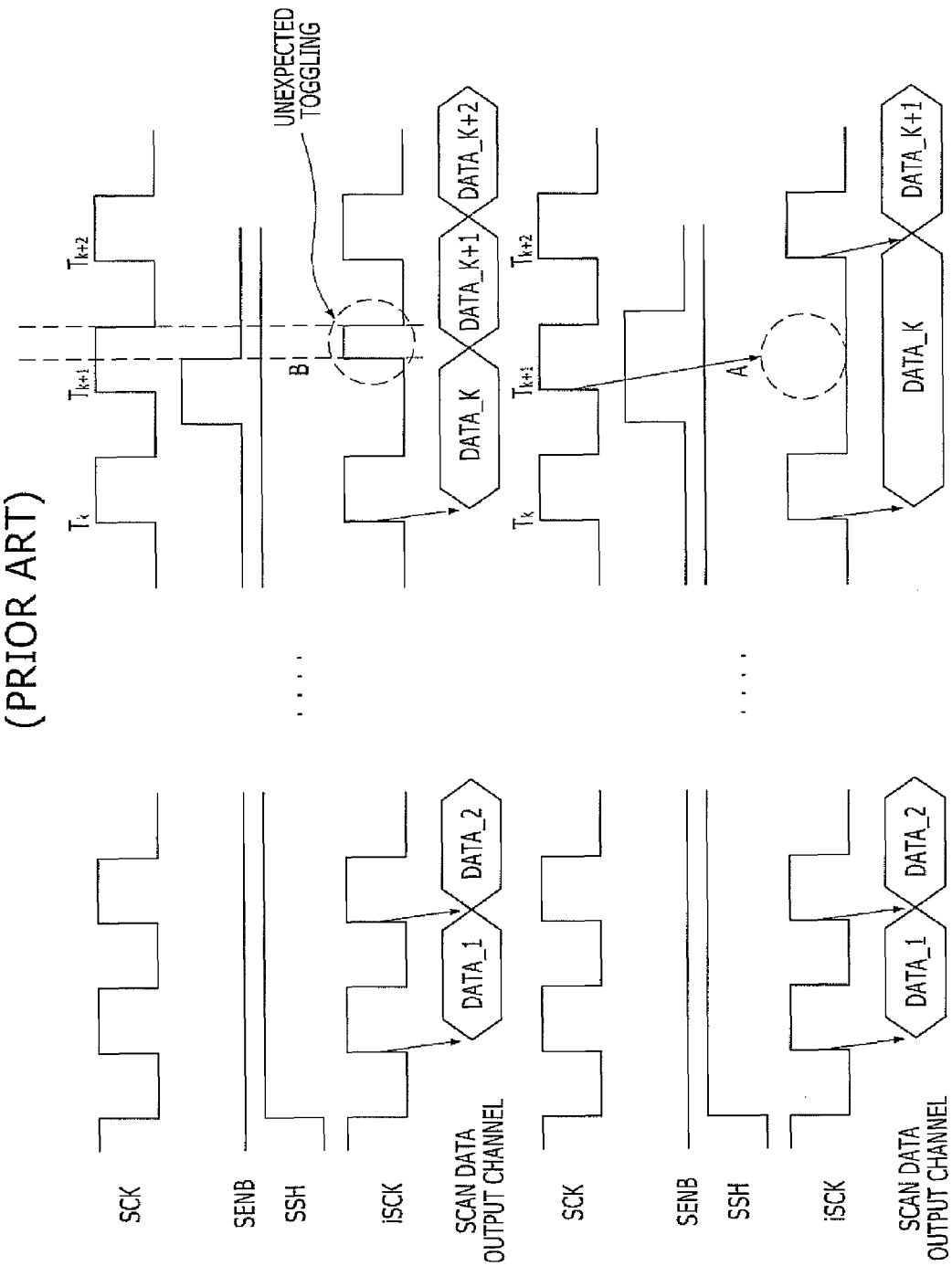
FIG. 3 is a timing diagram illustrating an operation of the circuit performing a boundary scan test in the conventional semiconductor device shown in FIG. 2.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
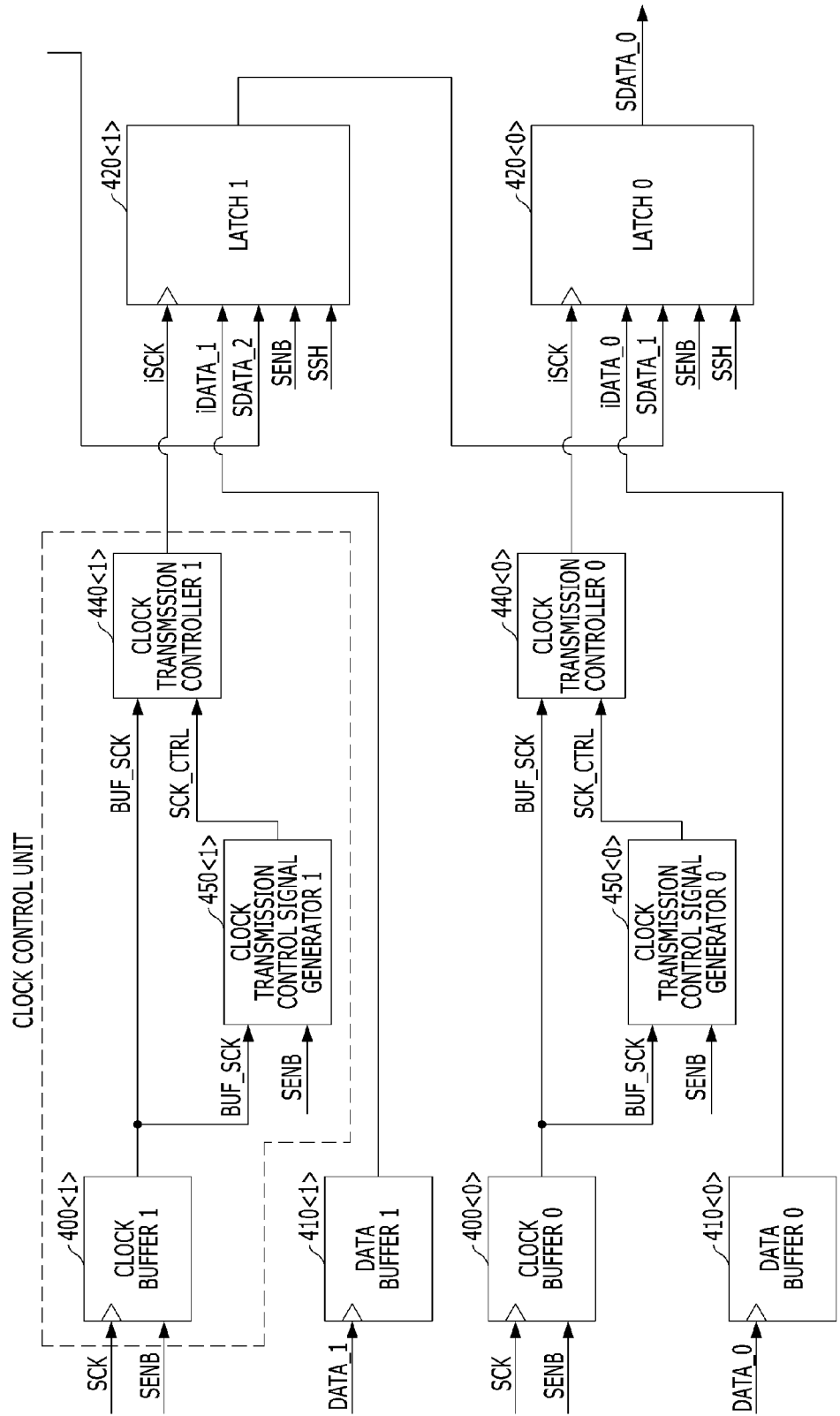
FIG. 4 is a block diagram illustrating a circuit to perform a boundary scan test in a semiconductor device in accordance with an exemplary embodiment of the present invention.

FIG. 4 is a block diagram illustrating a circuit to perform a boundary scan test in a semiconductor device in accordance with an exemplary embodiment of the present invention.

Referring to FIG. 4, the circuit includes a plurality of clock control units 400<0>, 400<1>, . . . , 440<0>, 440<1>, . . . , and 450<0>, 450<1>, . . . , a plurality of latches 420<0>, 420<1>, . . . , and a plurality of data buffers 410<0>, 410<1>, . . . . The plurality of clock control units 400<0>, 400<1>, . . . , 440<0>, 440<1>, . . . , and 450<0>, 450<1>, . . . are configured to receive and buffer a boundary test clock signal SCK in a boundary scan test mode to output synchronized boundary test clock signals iSCK such that an edge of the boundary test clock signal iSCK are synchronized with an entry time point of the boundary scan test mode. The plurality of latches 420<0>, 420<1>, . . . are configured to receive and store a plurality of data iDATA_0, iDATA_1, . . . in parallel in a boundary capture test mode and form a boundary scan path to sequentially output the plurality of stored data SDATA_0, SDATA_1, . . . in the boundary scan test mode. The operations of the latches 420<0>, 420<1>, . . . are controlled in response to the boundary test clock signals iSCK The plurality of data buffers 410<0>, 410<1>, . . . are configured to buffer a plurality of external data DATA_0, DATA_1, . . . to output the plurality of data iDATA_0, iDATA_1, . . . .

The clock control units 400<0>, 400<1>, . . . , 440<0>, 440<1>, . . . , and 450<0>, 450<1>, . . . include a plurality of clock buffers 400<0>, 400<1>, . . . , a plurality of clock transmission controllers 440<0>, 440<1>, . . . , and a plurality of clock transmission control signal generators 450<0>, 450<1>, . . . . The plurality of clock buffers 400<0>, 400<1>, . . . are configured to buffer the boundary test clock signal SCK in response to a scan test entry signal SENB corresponding to an entry/exit of the boundary scan test mode. The plurality of clock transmission controllers 440<0>, 440<1>, . . . are configured to output an output clock signal BUF_SCK of the clock buffers 400<0>, 400<1>, . . . as the synchronized boundary test clock signal iSCK in response to a clock transmission control signal SCK_CTRL. The plurality of clock transmission control signal generators 450<0>, 450<1>, . . . are configured to activate the clock transmission control signal SCK_CTRL at an activation time point of the scan test entry signal SENB and deactivate the clock transmission control signal SCK_CTRL at the later time point between a deactivation time point of the scan test entry signal SENB and a deactivation time point of the output clock signal BUF_SCK of the clock buffers.

The respective latches 420<0>, 420<1>, . . . store the data iDATA_0, iDATA_1, . . . which are inputted in response to the activation of a capture test entry signal SSH corresponding to an entry/exit of the boundary capture test mode and the synchronized boundary test clock signal iSCK during the activation period of the scan test entry signal SENB, output the stored data SDATA_0, SDATA_1, . . . to the boundary scan path in response to the deactivation of the capture test entry signal SSH and the activation of the synchronized boundary test clock signal iSCK during the activation period of the scan test entry signal SENB, and hold the stored data SDATA_0, SDATA_1, . . . regardless of the activation of the capture test entry signal SSH during the deactivation period of the scan test entry signal SENB. That is, during the deactivation period of the scan test entry signal SENB, the previously-outputted data remains in the boundary scan path.

The data SDATA_0, SDATA_1, . . . transmitted through the boundary scan path are outputted to the outside of the semiconductor device through a scan data output channel which is not illustrated in the drawing and indicates a preset data output pad.

Figure 5:
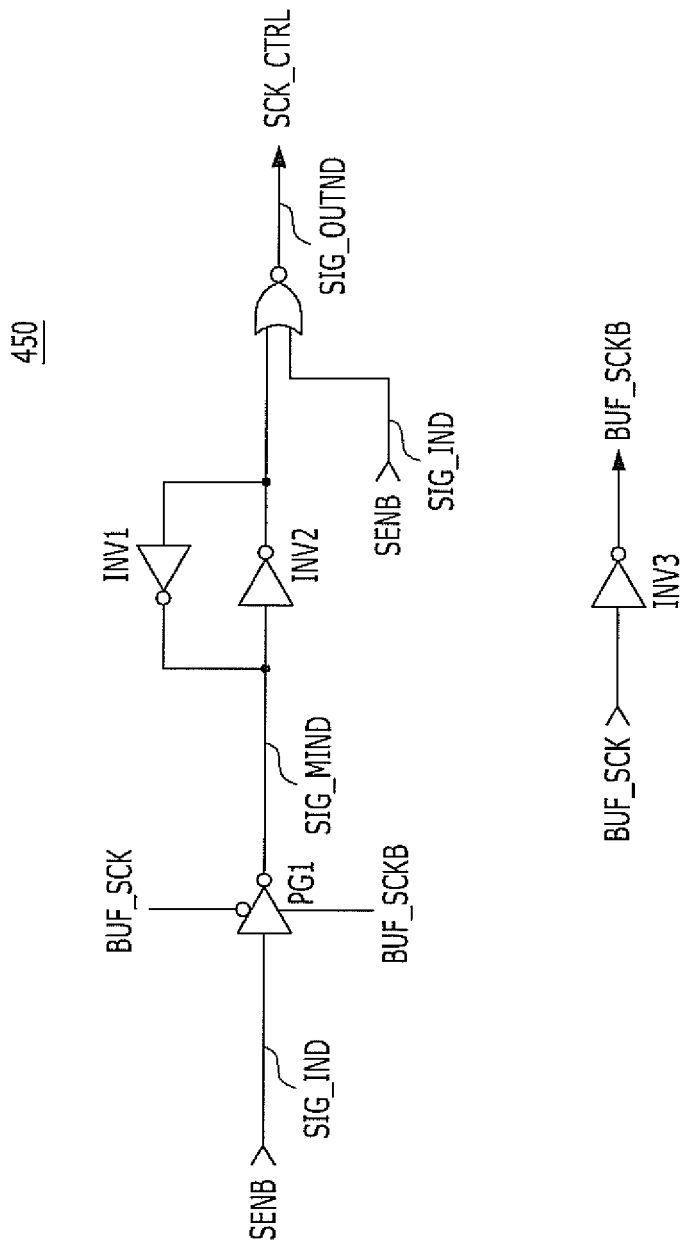
FIG. 5 is a detailed circuit diagram of a clock transmission control signal generator shown in FIG. 4 in accordance with the exemplary embodiment of the present invention.

FIG. 5 is a detailed circuit diagram of the clock transmission control signal generator shown in FIG. 4 in accordance with the exemplary embodiment of the present invention.

Referring to FIG. 5, each of the clock transmission control signal generators 450<0>, 450<1>, . . . includes an inverter INV3, a pass gate PG1, inverters INV1 and INV2, and a NOR gate NOR1. The inverter INV3 is configured to receive the output clock signal BUF_SCK of the corresponding clock buffer and generate an inverted output clock signal BUF_SCKB. The pass gate PG1 is configured to control the transmission of the scan test entry signal SENB applied through a signal input node SIG_IND to a signal middle node SIG_MIND in response to the output clock signal BUF_SCK and the inverted output clock signal BUF_SCKB. The inverters INV1 and INV2 are configured to latch the logic level of the signal middle node SIG_MIND. The NOR gate NOR1 is configured to perform a NOR operation on the logic level of the signal middle node SIG_MIND and the logic level of the signal input node SIG_IND and determine the logic level of the clock transmission control signal SCK_CTRL outputted through a signal output node SIG_OUTND.

The operation of the circuit to perform the boundary scan test in the semiconductor device in accordance with the exemplary embodiment of the present invention will be described with reference to the above-described configuration.

First, the operation of the clock transmission control signal generators 450<0>, 450<1>, . . . will be described. When the scan test entry signal SENB transitions from the deactivation state at a logic high level to the activation state at a logic low level, the clock transmission control signal generators 450<0>, 450<1>, . . . immediately activate the clock transmission control signal SCK_CTRL to a logic high level if the output clock signals BUF_SCK of the clock buffers 400<0>, 400<1>, . . . are at a logic low level. However, if the output clock signals BUF_SCK of the clock buffers 400<0>, 400<1>, . . . are at a logic high level when the scan test entry signal SENB transitions from the deactivation state at a logic high level to the activation state at a logic low level, the clock transmission control signal generators 450<0>, 450<1>, . . . activate the clock transmission control signal SCK_CTRL to a logic high level after the output clock signals BUF_SCK of the clock buffers 400<0>, 400<1>, . . . are deactivated to a logic low level.

Then, the clock transmission controllers 440<0>, 440<1>, . . . determine whether or not to output the output clock signals BUF_SCK of the clock buffers 400<0>, 400<1>, . . . as the synchronized boundary test clock signals iSCK based on the logic level of the clock transmission control signal SCK_CTRL. For example, in a case that the clock transmission control signal SCK_CTRL is activated to a logic high level, the output clock signals BUF_SCK of the clock buffers 400<0>, 400<1>, . . . are outputted as the synchronized boundary test clock signals iSCK. However, in a state that the clock transmission control signal SCK_CTRL is deactivated to a logic low, the synchronized boundary test clock signals iSCK are not outputted, regardless of whether the output clock signals BUF_SCK of the clock buffers 400<0>, 400<1>, . . . are inputted or not.

The plurality of latches 420<0>, 420<1>, . . . store the data iDATA_0, iDATA_1, . . . inputted through the data buffers 410<0>, 410<1>, . . . at rising edges of the synchronized boundary test clock signal iSCK in a state that both of the scan test entry signal SENB and the capture test entry signal SSH are activated to a logic low level. However, when the capture test entry signal SSH is deactivated to a logic high level in a state that the scan test entry signal SENB is activated to a logic low level, the latches 420<0>, 420<1>, . . . output the stored data SDATA_0, SDATA_1, . . . to the boundary scan path at rising edges of the synchronized boundary test clock signal iSCK. Furthermore, in a state that the scan test entry signal SENB is deactivated to a logic high level, the latches 420<0>, 420<1>, . . . hold the stored data SDATA_0, SDATA_1, . . . regardless of whether the capture test entry signal SSH and the synchronized boundary test clock signal iSCK are activated or deactivated.

FIG. 6 is a timing diagram illustrating the operation of the circuit performing a boundary scan test in the semiconductor device shown in FIG. 4 in accordance with the exemplary embodiment of the present invention.

Referring to FIG. 6, the circuit performing a boundary scan test in the semiconductor device in accordance with the embodiment of the present invention sequentially outputs the data SDATA_0, SDATA_1, SDATA_2, and SDATA_3 at the rising edges of the synchronized boundary test clock signal iSCK in a state that the scan test entry signal SENB is activated to a logic low level and the capture test entry signal SSH is deactivated to a logic high level.

At the moment that the scan test entry signal SENB transitions from the activation state at a logic low level to the deactivation state at a logic high level and the boundary scan test mode ceases while the plurality of data DATA_0, DATA_1, DATA_2, and DATA_3 are sequentially outputted through the scan data output channel, the synchronized boundary test clock signal iSCK stops toggling regardless of the toggling of the boundary test clock signal SCK. The outputting data DATA_2 is maintained as a holding state so as to be outputted through the scan data output channel.

After a time point when the scan test entry signal SENB transitions from the deactivation state at a logic high level to the activation state at a logic low level and the boundary scan test mode starts, the holding state of the outputting data DATA_2 ends, and the next data are successively outputted at the respective rising edges of the synchronized boundary test clock iSCK.

That is, the plurality of data SDATA_0, SDATA_1, SDATA_2, and SDATA_3 stored in the respective latches 420<0>, 420<1>, . . . are outputted through the scan data output channel, based on the logic level of the scan test entry signal SENB.

Furthermore, although the scan test entry signal SENB transitions from the deactivation state at a logic high level to the activation state at a logic low level in the activation period of the boundary test clock signal SCK, the synchronized boundary test clock signal iSCK is not unexpectedly toggled.

Specifically, the time point when the scan test entry signal SENB transitions from the deactivation state at a logic high level to the activation state at a logic low level may precede the time point when the boundary test clock signal SCK transitions from the activation state at a logic high level to the deactivation state at a logic low level. Accordingly, the clock transmission control signal SCK_CTRL does not transition from the deactivation state at a logic low level to the activation state at a logic high level at the activation transition time point of the scan test entry signal SENB, but transitions from the deactivation state at a logic low level to the activation state at a logic high level at the deactivation transition time point of the boundary test clock signal SCK.

As the clock transmission control signal SCK_CTRL is activated in response to the deactivation transition time point of the boundary test clock signal SCK, the synchronized boundary test clock signal iSCK is not unexpectedly toggled even if the boundary test clock signal SCK maintains the activation period after the activation transition time point of the scan test entry signal SENB.

Therefore, after the scan test entry signal SENB transitions from the deactivation state at a logic high level to the activation state at a logic low level, the holding state of the outputting data DATA_2 ends at a rising edge of the synchronized boundary test clock signal iSCK, and the next data DATA_3 and DATA_4 are outputted at the respective rising edges of the synchronized boundary test clock signal iSCK. That is, the operation is properly performed without any error.

In the above-described semiconductor device to perform a boundary scan test in accordance with the embodiment of the present invention, even when the phases of the scan test entry signal SENB and the boundary test clock signal SCK do not accurately coincide with each other, the output time points of data which are sequentially outputted may be effectively controlled.

While the present invention has been described with respect to the specific embodiments, it will be apparent to those skilled in the art that various changes and modifications may be made without departing from the spirit and scope of the invention as defined in the following claims.

For example, the positions and types of logic gates and transistors may differ depending on the polarity of an inputted signal.

What is claimed is:

1. A semiconductor device comprising:
a clock control unit configured to receive an external test clock signal in a boundary scan test mode and generate a boundary test clock signal during the boundary scan test mode; and
a plurality of latches configured to form a boundary scan path to sequentially output the plurality of stored data in the boundary scan test mode in response to the boundary test clock signal,
wherein the clock control unit comprises:
a clock buffer configured to buffer the external test clock signal in response to a scan test entry signal indicating an entry/exit of the boundary scan test mode and output the buffered external test clock signal as an output clock signal; and
a clock transmission control signal generator configured to activate the clock transmission control signal at an activation transitioning point of the scan test entry signal and deactivate the clock transmission control signal at the later transitioning point between a deactivation transitioning point of the scan test entry signal and a deactivation transitioning point of the output clock signal of the clock buffer.

2. The semiconductor device of claim 1., wherein the plurality of latches receive and store a plurality of data in parallel in a boundary capture test mode.

3. The semiconductor device of claim 1, wherein the clock control unit further comprising:
a clock transmission controller configured to output an output clock signal of the clock buffer as the boundary test clock signal in response to a clock transmission control signal.

4. The semiconductor device of claim 1, wherein, during an activation period of the scan test entry signal, each of the latches is configured to store an input data in response to the boundary test clock signal, when a capture test entry signal indicating an entry/exit of the boundary capture test mode is activated, and output the stored data to the boundary scan path in response to the boundary test clock signal, when the capture test entry signal is deactivated,
wherein, during a deactivation period of the scan test entry signal, the each of the latches is configured to hold the stored data regardless of the capture test entry signal.

5. The semiconductor device of claim 1, wherein the data transmitted through the boundary scan path are outputted through a scan data output channel of the semiconductor device.

6. A semiconductor device comprising:
at least one latch configured to store test data serially received from an outside;
a scan path configured to output serially the test data stored in the latch; and
a control unit configured to control the latch to serially store the test data in a boundary capture test mode and control the scan path to serially output the test data stored in the latch in a boundary scan test mode,
wherein the control unit is configured to control a test data outputted at a first moment in which the semiconductor device exits from the boundary scan test mode to be held as an output data, and
the control unit is configured to control a next test data subsequent to the held test data to be outputted at a second moment after the first moment, in which the semiconductor device enters the boundary scan test mode again,
wherein the control unit comprises:
a clock buffer configured to buffer the test clock signal in response to the scan test ent signal; and
a clock transmission control signal generator configured to activate the clock transmission control signal at an activation transitioning point of the scan test entry signal and deactivate the clock transmission control signal at the later transitioning point between a deactivation transitioning point of the scan test entry signal and a deactivation transitioning point of the output clock signal of the clock buffer.

7. The semiconductor device of claim 6, wherein the control unit is configured to control a storing operation of the latch in response to a test clock signal and a scan test entry signal indicating an entry of the boundary scan test mode.

8. The semiconductor device of claim 7, wherein the control unit is configured to control an output operation of the scan path in response to the test clock signal, the scan test entry signal, and a capture test entry signal indicating an entry of the boundary capture test mode.

9. The semiconductor device of claim 8, wherein the control unit further comprising:
a clock transmission controller configured to output an output clock signal of the clock buffer as a boundary test clock signal in response to a clock transmission control signal.

10. The semiconductor device of claim 9, wherein, during an activation period of the scan test entry signal, the latch is configured to store the test data in response to the boundary test clock signal, when the capture test entry signal is activated, and output the stored test data to the scan path in response to the boundary test clock signal, when the capture test entry signal is deactivated, wherein, during a deactivation period of the scan test entry signal, the latch is configured to hold the stored test data regardless of the capture test entry signal.

* * * * *